US007957461B2

(12) United States Patent
Huang et al.

(10) Patent No.: US 7,957,461 B2
(45) Date of Patent: Jun. 7, 2011

(54) CALIBRATING AUTOMATIC TEST EQUIPMENT

(75) Inventors: Li Huang, Westlake Village, CA (US); Timothy Derksen, Tucker, GA (US); Xiaoxi Zhang, Tarzana, CA (US); Charles Evans Crapuchettes, Santa Clara, CA (US); Stephen Hauptman, Camarillo, CA (US)

(73) Assignee: Teradyne, Inc., North Reading, MA (US)

( * ) Notice: Subject to any disclaimer, the term of this patent is extended or adjusted under 35 U.S.C. 154(b) by 861 days.

(21) Appl. No.: 11/095,755

(22) Filed: Mar. 31, 2005

(65) Prior Publication Data
US 2006/0236157 A1 Oct. 19, 2006

(51) Int. Cl.
*H04B 3/46* (2006.01)
(52) U.S. Cl. ........ 375/226; 375/224; 375/225; 370/229; 370/234; 714/700; 714/741
(58) Field of Classification Search ........... 375/226, 375/224, 225; 370/229–234; 714/700, 741
See application file for complete search history.

(56) References Cited

U.S. PATENT DOCUMENTS

| | | | |
|---|---|---|---|
| 5,526,291 A | 6/1996 | Lennen | |
| 5,757,677 A | 5/1998 | Lennen | |
| 6,275,544 B1 | 8/2001 | Aiello et al. | |
| 6,492,797 B1 * | 12/2002 | Maassen et al. | 324/74 |
| 6,566,890 B2 | 5/2003 | Hauptman | |
| 7,120,840 B1 * | 10/2006 | Shimanouchi | 714/700 |
| 2002/0121904 A1 * | 9/2002 | Hauptman | 324/601 |
| 2003/0234645 A1 * | 12/2003 | Iorga | 324/158.1 |

FOREIGN PATENT DOCUMENTS
WO WO2006/107467 10/2006

OTHER PUBLICATIONS

Thaler et al., "A Suite of Novel Digital ATE Timing Calibration Methods", Proc. of the IEEE Int'l Test Conference on Discover the New World of Test and Design (Sep. 20-24, 1992). IEEE Computer Society, Washington, DC, pp. 520-529.
International Search Report and Written Opinion in corresponding Application No. PCT/US06/07186, dated Mar. 17, 2008.
International Preliminary Report on Patentability in Application No. PCT/US2006/007186, dated May 15, 2008.

(Continued)

*Primary Examiner* — David C Payne
*Assistant Examiner* — Zewdu Kassa
(74) *Attorney, Agent, or Firm* — Fish & Richardson P.C.

(57) ABSTRACT

Calibrating automatic test equipment (ATE) includes determining an offset between a reference timing event and a channel event, where the channel event is associated with a communication channel of the ATE, and adjusting signal transmission over the communication channel based on the offset. Determining the offset may include obtaining a first time at which a reference timing signal is received at a device associated with a reference timing source, obtaining a second time at which the reference timing signal is received at a device associated with the communication channel, obtaining a third time at which a channel signal is received at the device associated with the communication channel, obtaining a fourth time at which the channel signal is received at the device associated with the reference timing source, and calculating the offset using the first time, the second time, the third time, and the fourth time.

20 Claims, 4 Drawing Sheets

OTHER PUBLICATIONS

Letter from Foreign Associate and Examination Report in Singapore Patent Application No. SG 200706761-4, dated Mar. 31, 2005.
Office Action in Chinese Application No. 200680011020.2, dated Feb. 12, 2010 and Letter from Foreign Associate regarding action.
English Translation of Action in Korean Application No. KR10-2007-7022426, dated Jul. 31, 2009.
Amendment & Argument to Second Office Action in Korean Application No. KR10-2007-7022426, filed Sep. 29, 2009.
Decision for a Patent Grant in Korean Application No. KR10-2007-7022426, dated Jan. 28, 2010.
Response to Written Opinion in Singapore Application No. 200706761-4, filed Jan. 30, 2009.
International Preliminary Report on Patentability in Application No. PCT/US2006/007186, dated Jul. 3, 2008.
Office action dated Jan. 31, 2009, English translation, and proposal for response in counterpart Korean patent application No. 10-2007-7022426, 12 pgs.
Letter from associate reporting First office action issued Feb. 12, 2010 in counterpart Chinese application No. 200680011020.2, 9 pgs.
Letter dated Jul. 26, 2010 from associate reporting response to telephonic notification from Examiner in counterpart Chinese application No. 200680011020.2, 5 pgs.
Letter from associate dated Jun. 25, 2010 reporting response to office action as filed in counterpart Chinese application No. 200680011020.2, 9 pgs.
Written Opinion issued Sep. 26, 2008 in counterpart Singapore application No. 200706761-4, 6 pgs.
Response to office action filed Nov. 25, 2010 in corresponding foreign Japanese application No. 2008-504061, 11 pgs, including English-language copy of amended claims.
Response to Written Opinion filed Jan. 30, 2009 in counterpart Singapore application No. 200706761-4, 6 pgs.
Letter from associate dated Sep. 9, 2010 reporting office action issued Aug. 27, 2010 in counterpart Japanese application No. 2008-504061, 5 pgs.
English translation of Office action issued Jan. 31, 2009 in counterpart Korean application No. 10-2007-7022426, 8 pgs.
Letter from associate dated Mar. 18, 2009 reporting response to office action as filed in counterpart Korean application No. 10-2007-7022426, 29 pgs.
English translation of Office action issued Jul. 31, 2009 in counterpart Korean application No. 10-2007-7022426, 6 pgs.
Letter from associate dated Sep. 29, 2009 reporting response to office action as filed in counterpart Korean application No. 10-2007-7022426, 17 pgs.

* cited by examiner

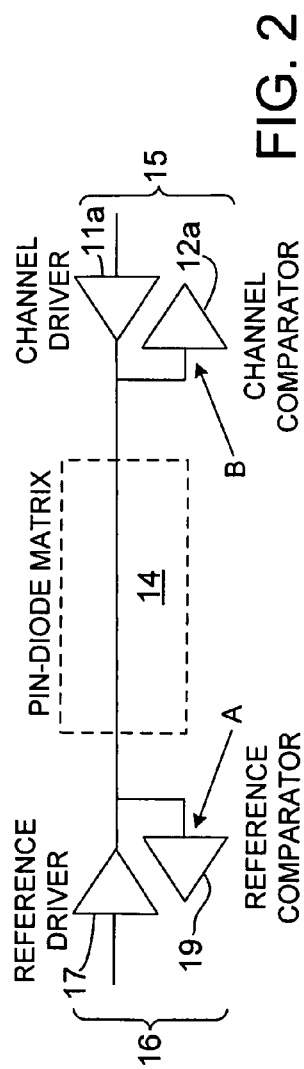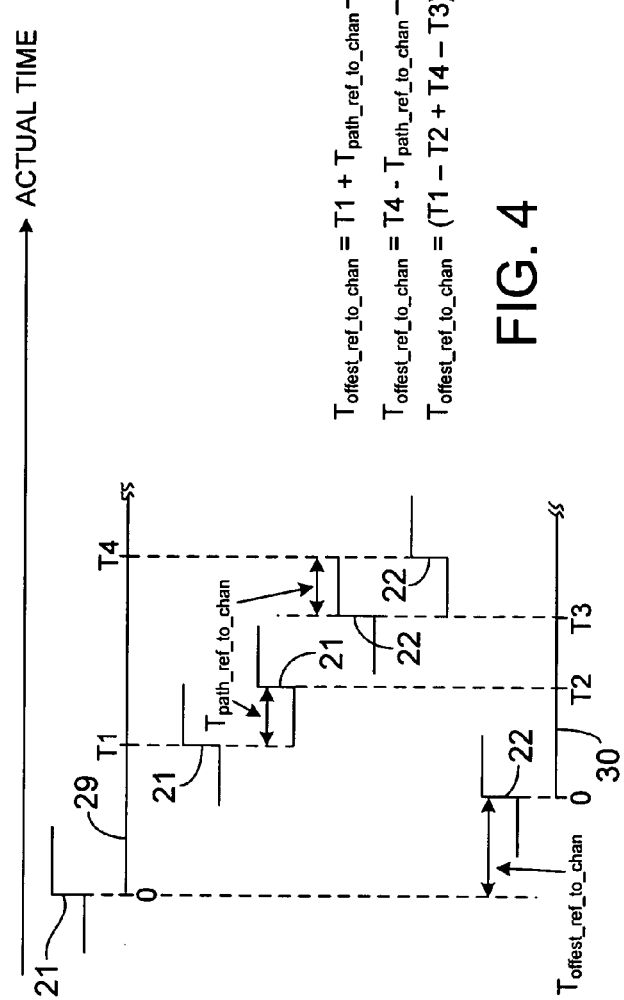
FIG. 2
FIG. 4
$T_{offest\_ref\_to\_chan} = T1 + T_{path\_ref\_to\_chan} - T2$
$T_{offest\_ref\_to\_chan} = T4 - T_{path\_ref\_to\_chan} - T3$
$T_{offest\_ref\_to\_chan} = (T1 - T2 + T4 - T3)/2$

CALIBRATING AUTOMATIC TEST EQUIPMENT

TECHNICAL FIELD

This patent application relates generally to calibrating automatic test equipment and, more particularly, to aligning test equipment channels to a reference timing source.

BACKGROUND

Automatic test equipment (ATE) refers to an automated, usually computer-driven, approach to testing devices, such as semiconductors, electronic circuits, and printed circuit board assemblies. A device tested by ATE is referred to as a device under test (DUT).

In ATE, timing accuracy refers to applying signals to the DUT that meet predefined timing constraints. For example, the rising edge of a signal may need to reach the DUT within a specified time-frame in order to test the DUT accurately. As the operational speeds of DUTs increase, timing accuracy becomes more critical, since there is typically less tolerance for signal time variations during testing.

The timing accuracy of ATE is dictated by its hardware and by techniques used to calibrate the ATE. For particular ATE, different calibration methods can yield different timing accuracies. Therefore, proper calibration is one way to improve timing accuracy without the often substantial cost of upgrading the ATE's hardware.

Timing accuracy can be measured in different ways. One commonly used calibration standard is called edge placement accuracy (EPA). In EPA, timing events for communication channels of an ATE, such as identification of signal edges, are measured using an external instrument. Discrepancies between measured signal edge timings and predetermined signal edge timings are defined to be the EPA of the ATE. An EPA of +/− 100 ps, or better, is required to test ATEs that operate at speeds of 400 MHz, or higher. To achieve such testing accuracy, two ATE calibration techniques are often used.

One such ATE calibration technique involves calibrating the ATE externally using a tool, such as a robot or cal-fixture. Another ATE calibration technique involves calibrating the ATE internally. This technique, known as time domain reflectometry (TDR), measures an incident signal edge and a reflected signal edge, and calculates a signal path length based on a difference between the two measurements. The signal path length is then used to adjust signal transmission. However, there is significant calibration error associated with TDR, which results mostly from signal degradation of the reflected edge. That is, the signal must travel twice through the signal path (the signal and its reflection must both travel through the signal path), resulting in signal loss and distortion. To counteract this problem, TDR requires high-bandwidth signal paths, such as relays.

SUMMARY

This patent application describes methods and apparatus, including computer program products, for calibrating devices, such as ATE.

In general, in one aspect, the invention is directed to method for use in calibrating an apparatus. The method includes determining an offset based on at least one of a reference timing event and a channel event, where the channel event is associated with a communication channel of the apparatus, and using the offset to calibrate the apparatus. This aspect of the invention may include one or more of the following features.

The reference timing event may include transmitting a reference timing signal from a reference timing source, and the channel event may include transmitting a channel signal from the communication channel. Determining the offset may include obtaining a first time at which the reference timing signal is received at a device associated with the reference timing source, obtaining a second time at which the reference timing signal is received at a device associated with the communication channel, obtaining a third time at which the channel signal is received at the device associated with the communication channel, obtaining a fourth time at which the channel signal is received at the device associated with the reference timing source, and calculating the offset using the first time, the second time, the third time, and the fourth time. The first time is T1, the second time is T2, the third time is T3, and the fourth time is T4, and the offset is calculated as (T1−T2+T4−T3)/2.

The method may also include configuring a path between the communication channel and the reference timing source. The channel signal and the reference timing signal may pass through the path. The path may include a matrix of circuit elements. The circuit elements may include pin-diodes. Configuring the path may include biasing the pin-diodes to obtain the path and to prevent exchange of signals between the reference timing source and other communication channels.

In general, in another aspect, the invention is directed to an apparatus for use in calibrating ATE. The apparatus includes a reference timing source configured to output a reference timing signal, a circuit path configured to pass the reference timing signal and to pass a channel signal from a communication channel of the ATE, and a processing device configured to determine an offset between the reference timing signal and the channel signal, and to issue an instruction that causes signal transmission over the communication channel to be adjusted based on the offset. This aspect of the invention may include one or more of the following features.

The reference timing source may include a reference comparator and a reference driver to output signals to the circuit path. The ATE may include a channel comparator and a channel driver to output signals to the circuit path. The reference comparator receives the reference timing signal at a first time, the channel comparator receives the reference timing signal at a second time path, the channel comparator receives the channel signal at a third time path, and the reference comparator receives the channel signal at a fourth time. The processing device receives the first time, the second time, the third time and the fourth time via the reference comparator and the channel comparator. The processing device calculates the offset using the first time, the second time, the third time, and the fourth time. The first time is T1, the second time is T2, the third time is T3, and the fourth time is T4. The processing device calculates the offset as (T1−T2+T4−T3)/2.

The circuit path may include a matrix of diodes and current sources to bias at least some of the diodes conducting or non-conducting in order to connect the communication channel to the reference timing source and to exclude other communication channels from connecting to the reference timing source. In this regard, the circuit path may include a current source, at least one diode, and a transistor switch to connect the current source to the at least one diode, thereby biasing the at least one diode conducting.

The processing device may be part of the ATE. The circuit path may not include relays and the processing device may determine the offset without first determining a signal path length between the communication channel and the reference timing source.

In general, in another aspect, the invention is directed to a machine-readable medium that stores executable instructions for use in calibrating ATE. The executable instructions cause a processing device to determine an offset between a reference timing event and a channel event, where the channel event is associated with a communication channel of the ATE, and to affect signal transmission over the communication channel based on the offset. Affecting signal transmission may include adjusting signal transmission directly or indirectly. This aspect may also include one or more of the features noted above with respect to the other aspects.

The details of one or more examples are set forth in the accompanying drawings and the description below. Further features, aspects, and advantages of the invention will become apparent from the description, the drawings, and the claims.

DESCRIPTION OF THE DRAWINGS

FIG. 2 is a diagram showing one of the connections in the matrix of FIG. 1.

FIG. 4 is a timing diagram that depicts propagations of signals between a communication channel of an ATE and a reference timing source.

Like reference numerals in different figures indicate like elements.

DETAILED DESCRIPTION

Figure 1:
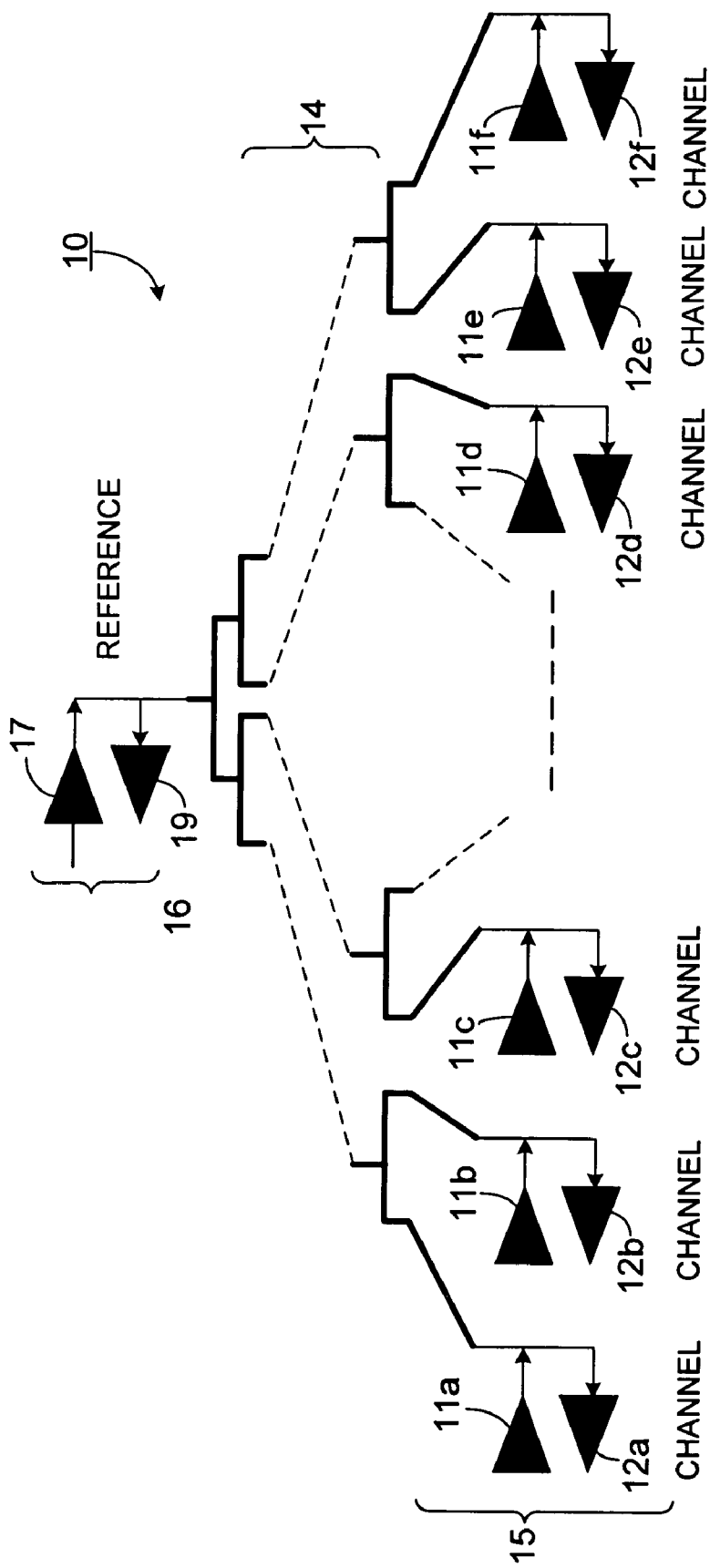
FIG. 1 is a diagram showing a matrix of connections between channels of an ATE and a reference timing source.

FIG. 1 shows circuitry 10 for use in calibrating an ATE. Circuitry 10 includes, for each ATE channel, a driver 11a to 11f, and a comparator 12a to 12f. A pin-diode matrix 14, described below, can connect the driver and comparator of each channel to a reference timing source 16, although a connection is made for only one channel at a time in this embodiment. Reference timing source 16 also includes a driver 17 and a comparator 19.

FIG. 2 shows a connection between a single channel 15 and reference timing source 16. In FIG. 2, pin-diode matrix 14 is shown as a single solid line in order to indicate a connection between channel 15, which includes driver 11a and comparator 12a, and reference timing source 16, which includes driver 17 and comparator 19. This is for illustration's sake only; as described below, pin-diode matrix 14 can include any number of switches and interconnections.

The operation of circuitry 10 is described with respect to channel 15. It is noted, however, that the operation of circuitry 10 is the same for all channels. In this regard, channel driver 11a outputs a channel signal, e.g., a voltage signal. The channel signal is output to pin-diode matrix 14, but is also received by channel comparator 12a. Channel comparator 12a identifies the time that it receives the channel signal, and provides this time to a processing device, such as a microprocessor (not shown). The processing device may be part of the ATE or it may be separate from the ATE. For example, the processing device may be incorporated into a separate circuit arrangement used to calibrate the ATE, which also may include reference timing source 16 and pin-diode matrix 14.

Channel comparator 12a also receives, typically at a different time, a reference timing signal, such as a voltage signal, from the driver of reference timing source 16 via pin-diode matrix 14. Channel comparator 12a identifies the time that it receives the reference timing signal, and provides this time to the processing device. Comparator 19 and driver 17 for reference timing source 16 operate in the same manner as comparator 12a and driver 11a for channel 15, as described below.

More specifically, reference driver 17 outputs the reference timing signal to pin-diode matrix 14. Reference comparator 19, however, also receives the reference timing signal. Reference comparator 19 identifies the time that it receives the reference timing signal, and provides that time to the processing device. Reference comparator 19 also receives, typically at a different time, the channel signal from channel driver 11a via pin-diode matrix 14. Reference comparator 19 identifies the time that it receives the channel signal, and provides this time to the processing device.

The processing device or, more accurately, software executing in the processing device, uses the times provided by channel comparator 12a and reference comparator 19 to determine an offset timing between the channel signal and the reference timing signal. This offset is used to correct the timing accuracy of channel 15, as described below.

In more detail, the ATE calibration process described herein calibrates all ATE channels, or a subset thereof, based on the actual time between a reference timing event and a channel event, namely $T_{offset\_ref\_to\_chan}$. In this context, the reference timing event corresponds to a transmission time of the reference timing signal and the channel event corresponds to a transmission time of the channel signal. See FIG. 4, described below.

The basic approach of the ATE calibration process is to identify times that edges of the reference timing signal and a channel signal arrive at the reference comparator and the channel comparator, and to determine $T_{offset\_ref\_to\_chan}$ using only these times. This approach for obtaining $T_{offset\_ref\_to\_chan}$ reduces the need to perform calibration using the signal path length, $T_{path\_ref\_to\_chan}$, as in TDR. As a result, high-bandwidth connections, such as relays, are typically not required between the ATE channels and the reference timing source.

Figure 3:
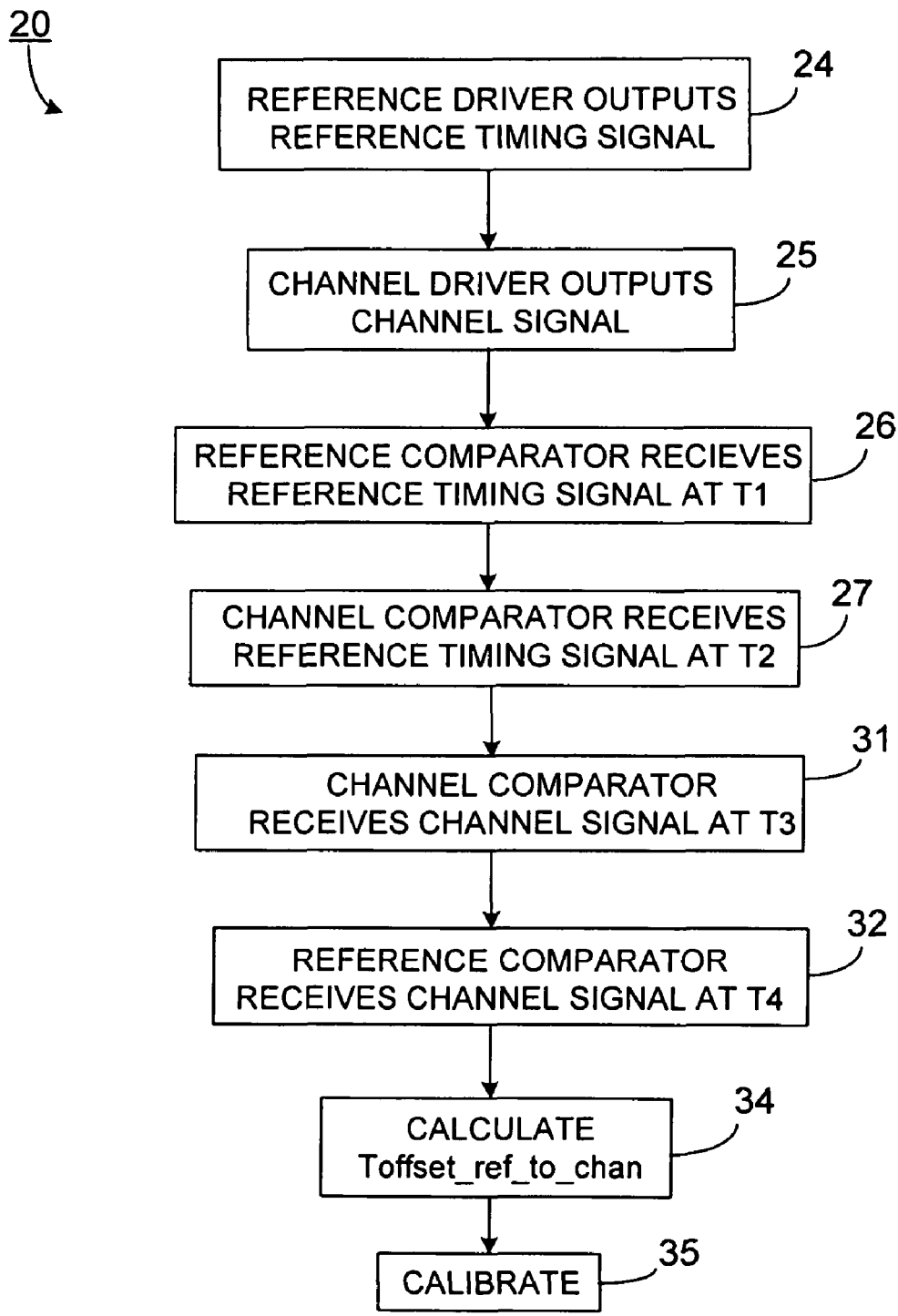
FIG. 3 is a flowchart showing a process for calibrating an ATE.

Referring to FIGS. 3 and 4, a process 20 is shown for determining $T_{offset\_ref\_to\_chan}$ using the circuitry of FIGS. 1 and 2. It is noted that, in FIG. 3, the reference and channel drivers are not driving at the same time, but rather in separate bursts. As shown in FIG. 4, $T_{offset\_ref\_to\_chan}$ is the difference in transmission times between reference timing signal 21 and channel signal 22. Process 20 obtains this value as follows. Reference driver 17 outputs (24) reference timing signal 21 to pin-diode matrix 14. Channel driver 11a outputs (25) channel signal 22 to pin-diode matrix 14. In this example, it is assumed that pin-diode matrix 14 is pre-configured to connect channel 15 only to reference timing source 16. Configuration of an exemplary implementation of pin-diode matrix 14 is described below.

Reference comparator 19 receives (26) reference timing signal 21 at time T1, and provides that time to the processing device. In this embodiment, receipt of a signal by a comparator means identification of an incident edge of that signal. In other embodiments, comparators may identify other signal features. Channel comparator 12a receives (27) reference timing signal 21 at time T2, and provides that time to the processing device. The time it takes reference timing signal 21 to travel from reference timing source 16 to ATE channel

15, i.e., $T_{path\_ref\_to\_chan}$, is the difference between T1 and T2 plus time offsets between the reference and channel comparators.

It is noted that time T1 and T4 (below) are measured at reference comparator 19 and, therefore, are measured with respect to the transmission of reference timing signal 21, namely on time scale 29. That is, the time at which reference timing signal 21 is transmitted is designated zero (0) on time scale 29. Time T2 and T3 (below) are measured at channel comparator 12*a* and, therefore, are measured with respect to the transmission of the channel signal, namely on time scale 30. The time at which channel signal 22 is transmitted is designated zero (0) on scale 30.

In process 20, channel comparator 12*a* receives (31) channel signal 22 at time T3, and provides that time to the processing device. Reference comparator 19 receives (32) channel signal 22 at time T4, and provides that time to the processing device.

The time it takes channel signal 22 to travel from the ATE channel to the reference timing source, i.e., $T_{path\_ref\_to\_chan}$, is the difference between T3 and T4 plus time offsets between the reference and channel comparators. As shown in FIG. 4, the time between T1 and T2 is about the same as between T3 and T4, since the distance both signals travel should be the same. $T_{path\_ref\_to\_chan}$ need not be calculated by process 20. However, $T_{path\_ref\_to\_chan}$ is used to derive the equation used by process 20 to calculate the offset, $T_{offset\_ref\_to\_chan}$, between reference timing source 16 and channel 15 (see below). Accordingly, $T_{path\_ref\_to\_chan}$ is depicted in FIG. 4.

In this regard, $T_{offset\_ref\_to\_chan}$ is determined using the following four time measurements: T1, T2, T3, T4. Because $T_{offset\_ref\_to\_chan}$ is determined using four times, process 20 is referred to as the four-way time domain transmission (TDT) calibration process. The following explains how $T_{offset\_ref\_to\_chan}$ is obtained using T1, T2, T3 and T4 As shown in FIG. 4, the following relationships hold true:

$$T_{offset\_ref\_to\_chan} = T1 + T_{path\_ref\_to\_chan} - T2$$

$$T_{offset\_ref\_to\_chan} = T4 - T_{path\_ref\_to\_chan} - T3$$

Adding the foregoing two equations together results in:

$$2 \cdot T_{offset\_ref\_to\_chan} = T1 - T2 + T4 - T3,$$

thereby eliminating $T_{path\_ref\_to\_chan}$ from the calculation of $T_{offset\_ref\_to\_chan}$. Solving for $T_{offset\_ref\_to\_chan}$ results in the following equation:

$$T_{offset\_ref\_to\_chan} = (T1 - T2 + T4 - T3)/2.$$

Thus, by virtue of process 20, it is possible to determine $T_{offset\_ref\_to\_chan}$ using only values for T1, T2, T3 and T4. The processing device used to implement process 20 may be programmed beforehand with the foregoing equation for $T_{offset\_ref\_to\_chan}$.

Accordingly, in process 20, the processing device receives the values for T1, T2, T3 and T4, and calculates (34) $T_{offset\_ref\_to\_chan}$ using those values. The values for T1, T2, T3 and T4 may be provided directly to the processing device from the reference and channel comparators, or they may first pass through other hardware and/or software.

Once the processing device determines the value of $T_{offset\_ref\_to\_chan}$, the processing device calibrates (35) communication channel 15, for which T1, T2, T3 and T4 were obtained. That is, $T_{offset\_ref\_to\_chan}$ may be determined for each channel of the ATE. So, once $T_{offset\_ref\_to\_chan}$ is determined for a channel, the processing device may adjustor offset signal transmission on that channel by an amount that is equal to, or derived from, $T_{offset\_ref\_to\_chan}$. For example, the processing device may issue an instruction to start transmission of signals on channel 15 earlier by an amount equal to $T_{offset\_ref\_to\_chan}$, or the processing device may issue an instruction to delay transmission of signals on channel 15 by an amount equal to $T_{offset\_ref\_to\_chan}$. Communication channel signal adjustments other than, or in addition to, those described herein may be made using $T_{offset\_ref\_to\_chan}$.

It is noted that the processing device itself may not calibrate the ATE. Rather, the processing device may calibrate the ATE indirectly, e.g., by instructing other hardware or software, either on or off of the ATE, to adjust signal transmission accordingly. It is also noted that process 20 may be implemented without a processing device. For example, $T_{offset\_ref\_to\_chan}$ may be calculated manually, and calibration may be manual as well.

Each ATE channel may be calibrated with respect to the reference timing source in the manner described above. As a result, each calibrated ATE channel should be aligned to the reference timing source and to all other calibrated ATE channels.

Figure 5:
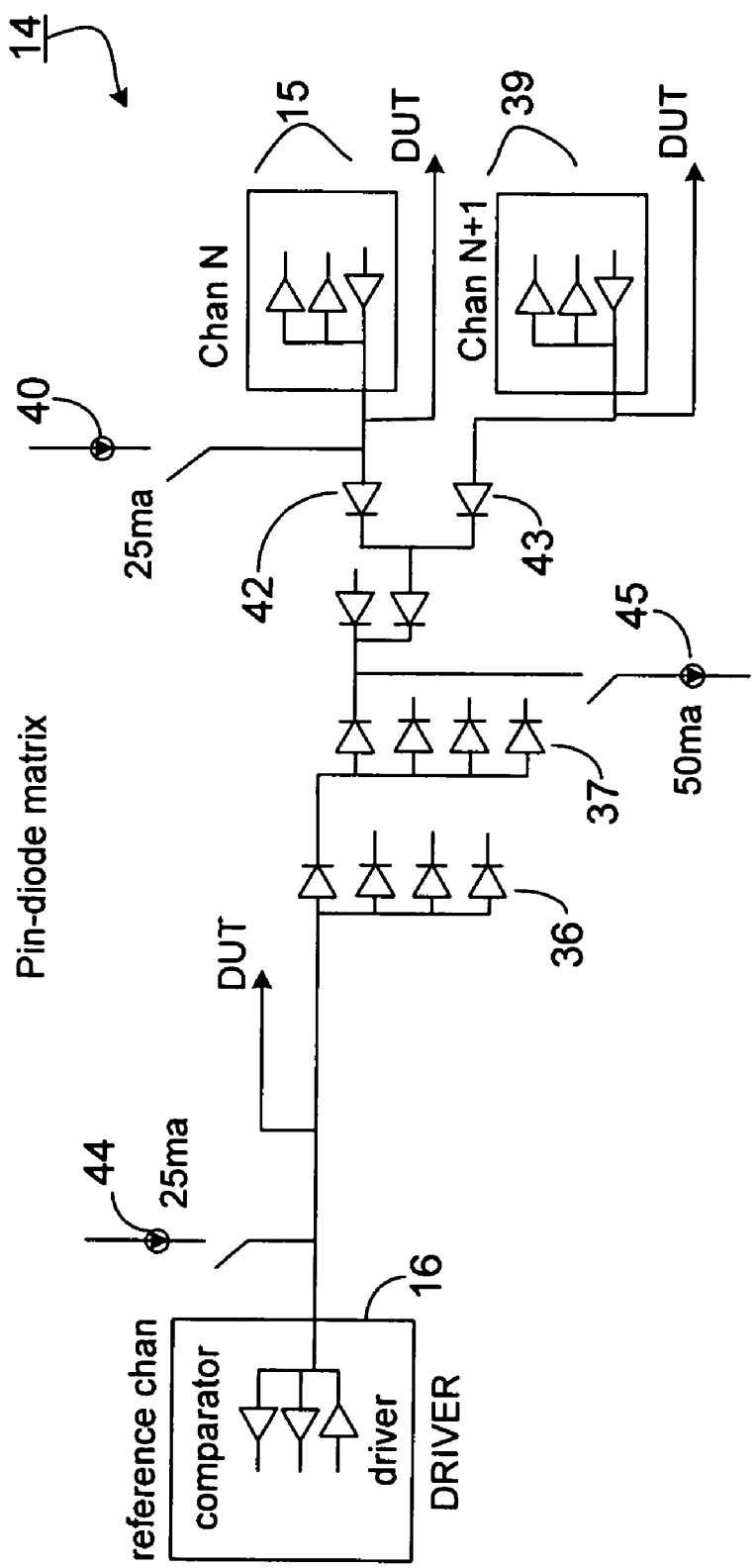
FIG. 5 is a diagram of a pin-diode matrix that may be used to implement connections between an ATE and a reference timing source.

FIG. 5 shows an exemplary implementation of pin-diode matrix 14. As shown in FIG. 5, pin-diode matrix includes diodes arranged in paths (e.g., 36, 37) between reference timing source 16 and ATE channels 15 (N), 39 (N+1). That is, each channel, such as channel 15, on one or more ATEs is connected to reference timing source 16 via a matrix of pin-diodes. Pin-diode matrix 14 also includes a current source 40 connected, through transistor/switch 41, to channel 15. Each channel may include a current source/transistor arrangement similar to, or identical to, that of channel 15. When transistor 41 is gated, current passes to channel 15, thereby biasing diode 42 and 43 conducting. By properly biasing diodes throughout pin-diode matrix 14 using also current sources 44 and 45 and others that are not shown, channel 15 can be connected to reference timing source 16, while all other channels are disconnected from reference timing source 16.

It is noted that a reference channel from reference timing source 16 can also be routed to a DUT via a normal signal path, and can be used as a standard channel during DUT testing.

Advantages of the pin-diode matrix design of FIG. 5 over a traditional relay matrix design include the following. First, a pin-diode has a smaller footprint than a relay—generally about 3% that of relay, resulting in board area savings. In high density digital instrument design, board space is often the main bottleneck for channel density. Any reduction in board space can reduce ATE costs and, possibly, improve its performance. Second, the reliability of pin-diodes generally exceeds that of relays, and a pin-diode matrix is typically more easily manufactured than a relay matrix. Thus, pin-diode matrix 14 is a low-cost, reliable solution for connecting a number of channels to a reference channel.

It is noted, however, that process 20 is not limited to use with pin-diode matrix 14, or to any of the hardware described herein for that matter. For example, process 20 may be implemented using a conventional relay matrix in lieu of pin-diode matrix 14, a combination matrix including both pin-diodes and relays, or by any other wired or wireless mechanism for connecting channels to a reference timing source. Such mechanisms may have a matrix configuration that is similar to the pin-diode configuration of FIG. 5, with various types of circuitry controlling configuration of the circuit path. The comparators and drivers also may be replaced with other circuitry, including hardware and/or software, for driving and detecting signals, and/or they may be augmented with signal conditioning and/or other circuitry, including hardware and/or software.

Process 20 has been tested on ATE systems with multiple high-density digital boards. The EPA following calibration has been shown to be within +/−100 ps for over 1000 channels—an accuracy that was heretofore only achievable using relatively expensive external robotics. Additionally, the calibration results have demonstrated repeatability, and the pin-diode matrix has proven to be reliable. Thus, process 20 and its associated hardware provides relatively high timing accuracy with low cost and reliability. Furthermore, the relatively small footprint of the pin-diodes makes it possible to build an extended matrix connecting a large number of channels, such as 64 or more channels, while consuming relatively little board space.

Process 20 is not limited to use with the hardware and software described herein. Process 20 can be implemented in digital electronic circuitry, or in computer hardware, firmware, software, or in combinations thereof.

Process 20 can be implemented, at least in part, via a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps associated with implementing process 20 can be performed by one or more programmable processors executing one or more computer programs to perform the functions of the processes. All or part of process 20 can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

The circuitry described herein, including the reference timing source, processing device, and pin-diode matrix, and/or portions thereof, may be implemented as part of ATE or as separate circuitry for use in conjunction with ATE. Likewise, part or all of this circuitry can be implemented on one or more DUTs being tested by the ATE.

Process 20 can be used to calibrate a receive-only device, meaning a device that receives signals but does not transmit signals. In this case, for example, values for T1 and T2 or T3 and T4 may be set to zero in the equation for $T_{offset\_ref\_to\_chan}$.

Process 20 can also be used to calibrate a DUT. In this regard, process 20 could be adapted to use the ATE's timing generator. For example, on a drive-only DUT channel, a D-flop may be added to an output cell to provide the DUT receive capability for calibration. The D input may be hooked-up to a chip pad, while the clock input and Q output of the flip-flop may be routed to 2 test pins on the DUT. Timing measurement may be effected using standard edge search techniques. To calibrate a receive only DUT pin, a driver would be added to the output cell that would be controlled by a test pin, and the Q output of a receiver pad would be routed to another test pin. An input/output (I/O) DUT pin could incorporate both of this circuitry. The two test pins could be shared amongst all the I/O cells, connecting to one at a time for calibration.

Elements of different embodiments described herein may be combined to form other embodiments not specifically set forth above. Other embodiments not specifically described herein are also within the scope of the following claims.

What is claimed is:

1. A method for use in calibrating an apparatus, the method comprising:

determining a timing offset between a reference signal and a channel signal over a signal path of the apparatus, the reference signal and the channel signal being output to the signal path at different times by different drivers at different ends of the signal path, the reference signal for aligning the channel signal and other channel signals, the timing offset being determined based on receipt times of the reference signal and the channel signal by comparators at different ends of the signal path and without determining a signal propagation time across a length of the signal path; and using the timing offset to calibrate the apparatus by adjusting times at which future channel signals are transmitted so that the future channel signals substantially align to the reference signal in time.

2. The method of claim 1, wherein the reference signal is transmitted from a reference timing source comprising a driver, and the channel signal is transmitted from a driver in communication with a communication channel.

3. The method of claim 2, wherein determining comprises:

obtaining a first time at which the reference signal is received at a comparator associated with the reference timing source;

obtaining a second time at which the reference signal is received at a comparator associated with the communication channel;

obtaining a third time at which the channel signal is received at the comparator associated with the communication channel;

obtaining a fourth time at which the channel signal is received at the comparator associated with the reference timing source; and calculating the timing offset using the first time, the second time, the third time, and the fourth time.

4. The method of claim 3, wherein the first time is T1, the second time is T2, the third time is T3, and the fourth time is T4; and wherein the timing offset is calculated as $(T1-T2+T4-T3)/2$.

5. The method of claim 3, further comprising:

configuring the signal path between the communication channel and the reference timing source, the channel signal and the timing signal passing through the signal path, the signal path comprising a matrix of circuit elements.

6. The method of claim 5, wherein the circuit elements comprise pin-diodes; and wherein configuring comprises biasing the pin-diodes to obtain the signal path and to prevent exchange of signals between the reference timing source and other communication channels.

7. An apparatus for use in calibrating automatic test equipment (ATE), comprising:

a reference timing source configured to output a reference signal, the reference timing source comprising a driver;

a signal path configured to pass the reference signal and to pass a channel signal from a communication channel, the reference signal for aligning the channel signal and other channel signals, the reference signal and the channel signal being output to the signal path at different times by different drivers at different ends of the signal path; and a processing device configured to determine a timing offset between the reference timing signal and the channel signal, and to issue an instruction that causes signal transmission over the signal path to be adjusted based on the offset by adjusting times at which future channel signals are transmitted so that the future channel signals substantially align to the reference signal;

wherein the processor is configured to determine the timing offset based on receipt times of the reference signal and the channel signal by comparators at different ends of the signal path and without determining a signal propagation time across a length of the signal path.

8. The apparatus of claim 7, wherein the reference timing source comprises a reference comparator and a reference driver to output signals to the signal path; and wherein the ATE comprises a channel comparator and a channel driver to output signals to the signal path.

9. The apparatus of claim 8, wherein the reference comparator is configured to receive the reference signal at a first time, the channel comparator is configured to receive the reference signal at a second time path, the channel comparator is configured to receive the channel signal at a third time path, and the reference comparator is configured to receive the channel signal at a fourth time;

wherein the processing device is configured to receive the first time, the second time, the third time and the fourth time via the reference comparator and the channel comparator; and wherein the processing device is configured to calculate the timing offset using the first time, the second time, the third time, and the fourth time.

10. The apparatus of claim 9, wherein the first time is T1, the second time is T2, the third time is T3, and the fourth time is T4; and wherein the processing device is configured to calculate the timing offset as (T1−T2+T4−T3)/2.

11. The apparatus of claim 7, wherein the signal path comprises a matrix of diodes and current sources to bias at least some of the diodes conducting or non-conducting in order to connect the communication channel to the reference timing source and to exclude other communication channels from connecting to the reference timing source.

12. The apparatus of claim 7, wherein the signal path comprises:

a current source;

at least one diode; and a transistor switch to connect the current source to the at least one diode, thereby biasing the at least one diode conducting.

13. The apparatus of claim 7, wherein the signal path comprises a matrix of relays that connect the communication channel to the reference timing source and that exclude other communication channels from connecting to the reference timing source.

14. The apparatus of claim 7, wherein the processing device is part of the ATE.

15. The apparatus of claim 7, wherein the signal path does not include relays.

16. A machine-readable medium that stores executable instructions for use in calibrating automatic test equipment (ATE), the executable instructions for causing a processing device to:

determine a timing offset between a reference signal and a channel signal over a signal path of the ATE, the reference signal and the channel signal being output to the signal path at different times by different drivers at different ends of the signal path, the reference signal for aligning the channel signal and other channel signals, the timing offset being determined based on receipt times of the reference signal and the channel signal by comparators at different ends of the signal path channel and without determining a signal propagation time across a length of the signal path; and affect signal transmission over the signal path based on the timing offset by adjusting times at which future channel signals are transmitted so that the future channel signals substantially align to the reference signal in time.

17. The machine-readable medium of claim 16, wherein the reference signal is transmitted from a reference timing source comprising a driver, and the channel signal is transmitted from a driver in communication with a communication channel.

18. The machine-readable medium of claim 17, wherein determining comprises:

obtaining a first time at which the reference signal is received at a comparator associated with the reference timing source;

obtaining a second time at which the reference signal is received at a comparator associated with the communication channel;

obtaining a third time at which the channel signal is received at the comparator associated with the communication channel;

obtaining a fourth time at which the channel signal is received at the comparator associated with the reference timing source; and calculating the timing offset using the first time, the second time, the third time, and the fourth time.

19. The machine-readable medium of claim 18, wherein the first time is T1, the second time is T2, the third time is T3, and the fourth time is T4; and wherein the timing offset is calculated as (T1−T2+T4−T3)/2.

20. The machine-readable medium of claim 16, wherein affecting signal transmission comprises adjusting signal transmission directly or indirectly.

* * * * *